United States Patent
Suzuki et al.

(10) Patent No.: US 11,749,722 B2
(45) Date of Patent: Sep. 5, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Takuma Suzuki, Himeji Hyogo (JP); Sozo Kanie, Himeji Hyogo (JP); Chiharu Ota, Kawasaki Kanagawa (JP); Susumu Obata, Yokokama Kanagawa (JP); Kazuhisa Goto, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 111 days.

(21) Appl. No.: 17/377,955

(22) Filed: Jul. 16, 2021

(65) Prior Publication Data
US 2022/0020853 A1 Jan. 20, 2022

(30) Foreign Application Priority Data
Jul. 17, 2020 (JP) ................................ 2020-122515

(51) Int. Cl.
- *H01L 29/16* (2006.01)
- *H01L 29/78* (2006.01)
- *H01L 29/32* (2006.01)
- *H01L 29/66* (2006.01)

(52) U.S. Cl.
CPC ......... *H01L 29/1608* (2013.01); *H01L 29/32* (2013.01); *H01L 29/66068* (2013.01); *H01L 29/7802* (2013.01)

(58) Field of Classification Search
None
See application file for complete search history.

(56) References Cited

U.S. PATENT DOCUMENTS

| | | | |
|---|---|---|---|
| 9,093,362 B2 * | 7/2015 | Shimizu | H01L 29/1608 |
| 9,786,742 B2 * | 10/2017 | Suzuki | H01L 29/0865 |
| 11,201,223 B2 * | 12/2021 | Shimizu | H01L 29/36 |
| 11,469,301 B2 * | 10/2022 | Shimizu | H01L 29/7802 |
| 2010/0283126 A1 | 11/2010 | Kiriyama et al. | |
| 2013/0234161 A1 * | 9/2013 | Shimizu | H01L 21/26506 257/77 |

FOREIGN PATENT DOCUMENTS

| | | |
|---|---|---|
| JP | 5543786 B2 | 7/2014 |
| JP | 2015-015493 A | 1/2015 |
| JP | 2015-216348 A | 12/2015 |
| JP | 2018-101789 A | 6/2018 |

* cited by examiner

*Primary Examiner* — Jack S Chen
(74) *Attorney, Agent, or Firm* — Allen & Overy LLP

(57) ABSTRACT

A semiconductor device of embodiments includes a silicon carbide layer having a first face and a second face, a gate electrode, a gate insulating layer on the first face. The silicon carbide layer includes a first silicon carbide region of a first conductive type; a second silicon carbide region of a second conductive type disposed between the first silicon carbide region and the first face; a third silicon carbide region of a second conductive type between the first silicon carbide region and the first face; a fourth silicon carbide region; a fifth silicon carbide region; a sixth silicon carbide region of a second conductive type between the first silicon carbide region and the first face and between the second silicon carbide region and the third silicon carbide region; and a crystal defect. The crystal defect is in the sixth silicon carbide region.

11 Claims, 8 Drawing Sheets

US 11,749,722 B2

SEMICONDUCTOR DEVICE

CROSS-REFERENCE TO RELATED APPLICATION

This application is based upon and claims the benefit of priority from Japanese Patent Application No. 2020-122515, filed on Jul. 17, 2020, the entire contents of which are incorporated herein by reference.

FIELD

Embodiments described herein relate generally to a semiconductor device.

BACKGROUND

Silicon carbide (SiC) is expected as a material for next-generation semiconductor devices. Silicon carbide has excellent physical properties, such as a bandgap of 3 times that of silicon (Si), a breakdown field strength of about 10 times that of silicon (Si), and a thermal conductivity of about 3 times that of silicon (Si). By using such characteristics, it is possible to realize a power semiconductor device that has a high breakdown voltage and low loss and that can operate at high temperature.

In a metal oxide semiconductor field effect transistor (MOSFET) using silicon carbide, a gate insulating layer having high reliability is required.

DETAILED DESCRIPTION

Figure 1:
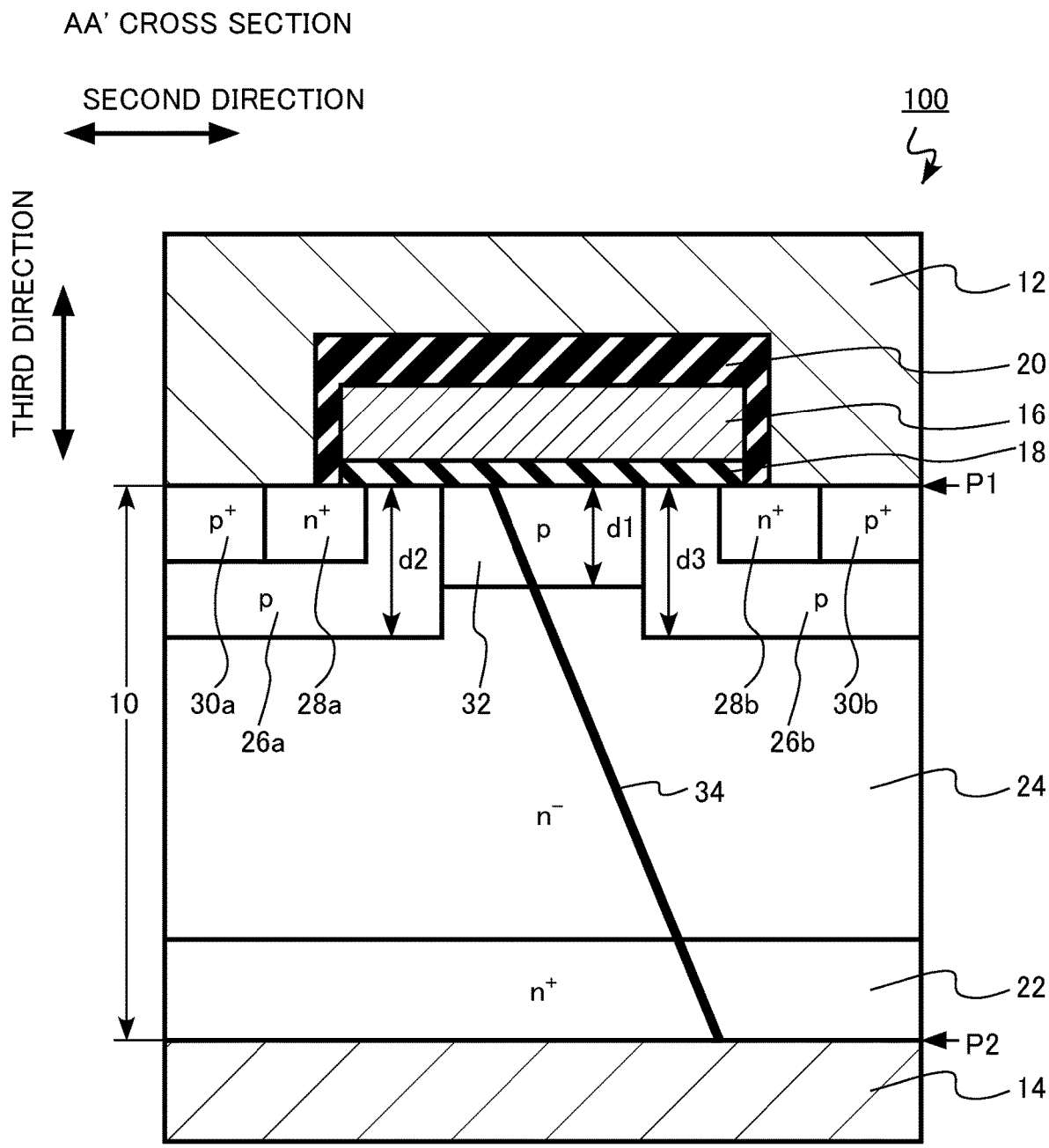
FIG. 1 is a schematic cross-sectional view of a semiconductor device of a first embodiment.

A semiconductor device of embodiments includes: a silicon carbide layer having a first face and a second face facing the first face and including: a first silicon carbide region of a first conductive type; a second silicon carbide region of a second conductive type disposed between the first silicon carbide region and the first face; a third silicon carbide region of a second conductive type disposed between the first silicon carbide region and the first face, the first silicon carbide region being interposed between the second silicon carbide region and the third silicon carbide region; a fourth silicon carbide region of a first conductive type disposed between the second silicon carbide region and the first face; a fifth silicon carbide region of a first conductive type disposed between the third silicon carbide region and the first face; a sixth silicon carbide region of a second conductive type disposed between the first silicon carbide region and the first face and disposed between the second silicon carbide region and the third silicon carbide region; and a crystal defect, at least a part of the crystal defect being disposed in the sixth silicon carbide region; a gate electrode disposed on a side of the first face of the silicon carbide layer; a gate insulating layer disposed between the second silicon carbide region and the gate electrode, between the third silicon carbide region and the gate electrode, and between the sixth silicon carbide region and the gate electrode; a first electrode disposed on a side of the first face of the silicon carbide layer; and a second electrode disposed on a side of the second face of the silicon carbide layer.

Hereinafter, embodiments will be described with reference to the diagrams. In the following description, the same or similar members and the like are denoted by the same reference numerals, and the description of the members and the like once described will be omitted as appropriate.

In addition, in the following description, when there are notations of $n^+$, n, $n^-$, $p^+$, p, and $p^-$, these indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of an impurity region can be calculated from, for example, an SCM image. In addition, the magnitude relationship of the distance such as the width or depth of the impurity region can be calculated from, for example, an image of a scanning electron microscope (SEM).

The thickness and the like of an insulating layer can be measured, for example, on a SIMS or transmission electron microscope (TEM) image.

In addition, in this specification, the "p-type impurity concentration" in the p-type silicon carbide region means the net p-type impurity concentration obtained by subtracting the n-type impurity concentration in the region from the p-type impurity concentration in the region. In addition, the "n-type impurity concentration" in the n-type silicon carbide region means the net n-type impurity concentration obtained by subtracting the p-type impurity concentration in the region from the n-type impurity concentration in the region.

In addition, unless otherwise specified in this specification, the impurity concentration in a specific region means the maximum impurity concentration in the region.

First Embodiment

A semiconductor device of a first embodiment includes: a silicon carbide layer having a first face and a second face facing the first face; a gate electrode; a gate insulating layer; a first electrode; and a second electrode. The silicon carbide layer includes: a first silicon carbide region of a first conductive type; a second silicon carbide region of a second conductive type disposed between the first silicon carbide region and the first face; a third silicon carbide region of a second conductive type disposed between the first silicon carbide region and the first face, the first silicon carbide region being interposed between the second silicon carbide region and the third silicon carbide region; a fourth silicon carbide region of a first conductive type disposed between the second silicon carbide region and the first face; a fifth silicon carbide region of a first conductive type disposed between the third silicon carbide region and the first face; a sixth silicon carbide region of a second conductive type disposed between the first silicon carbide region and the first face and disposed between the second silicon carbide region and the third silicon carbide region; and a crystal defect, at least a part of the crystal defect being disposed in the sixth silicon carbide region. The gate electrode is disposed on a side of the first face of the silicon carbide layer. The gate insulating layer is disposed between the second silicon carbide region and the gate electrode, between the third silicon carbide region and the gate electrode, and between the sixth silicon carbide region and the gate electrode. The first electrode is disposed on a side of the first face of the silicon carbide layer. The second electrode is disposed on a side of the second face of the silicon carbide layer.

The semiconductor device of the first embodiment is a MOSFET 100. The MOSFET 100 is a double implantation MOSFET (DIMOSFET) in which a base region and a source region are formed by ion implantation. In addition, the MOSFET 100 is an n-channel MOSFET having electrons as carriers. Hereinafter, a case where the first conductive type is n type and the second conductive type is p type will be described as an example.

Figure 2:
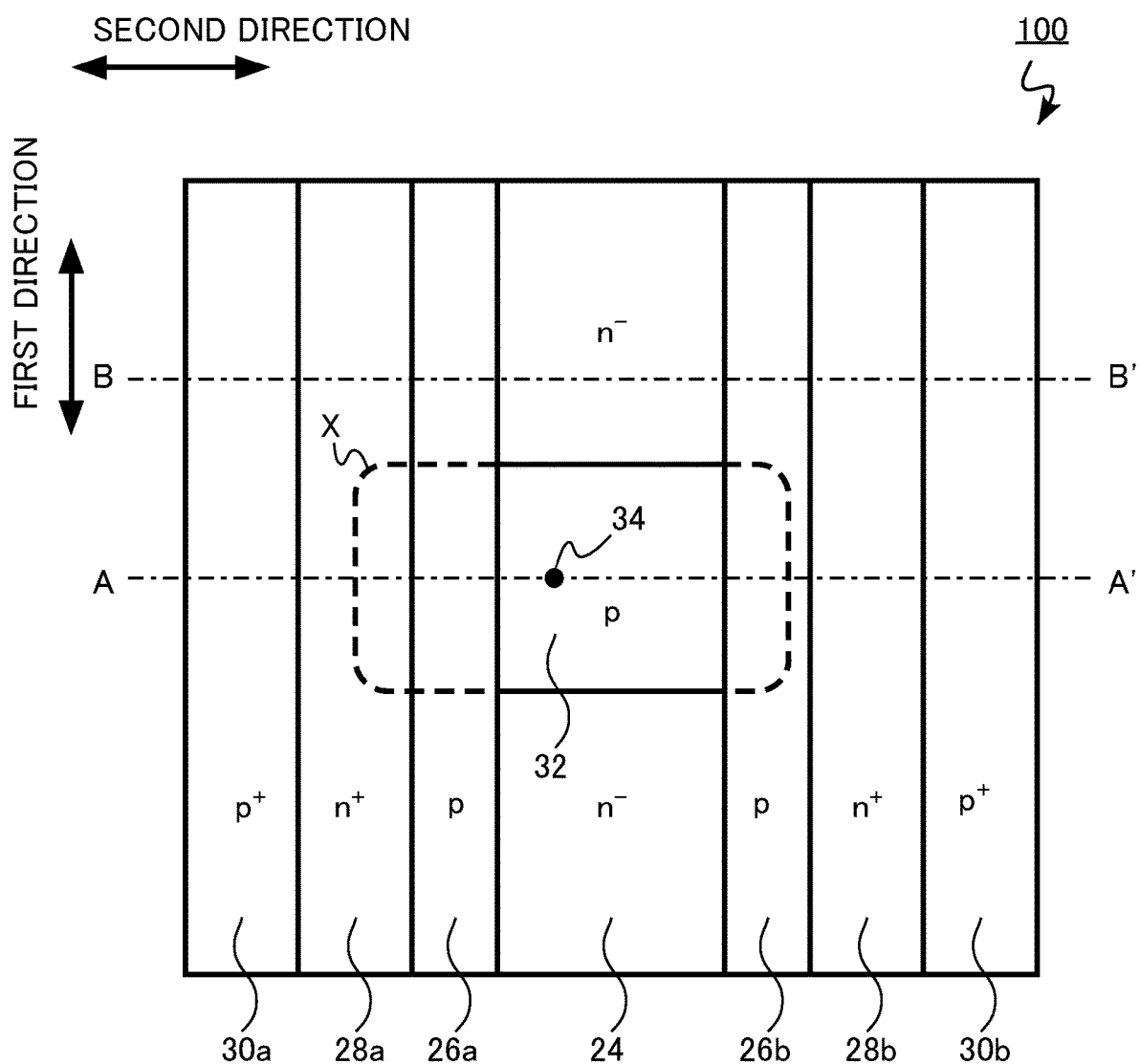
FIG. 2 is a schematic top view of the semiconductor device of the first embodiment.
Figure 3:
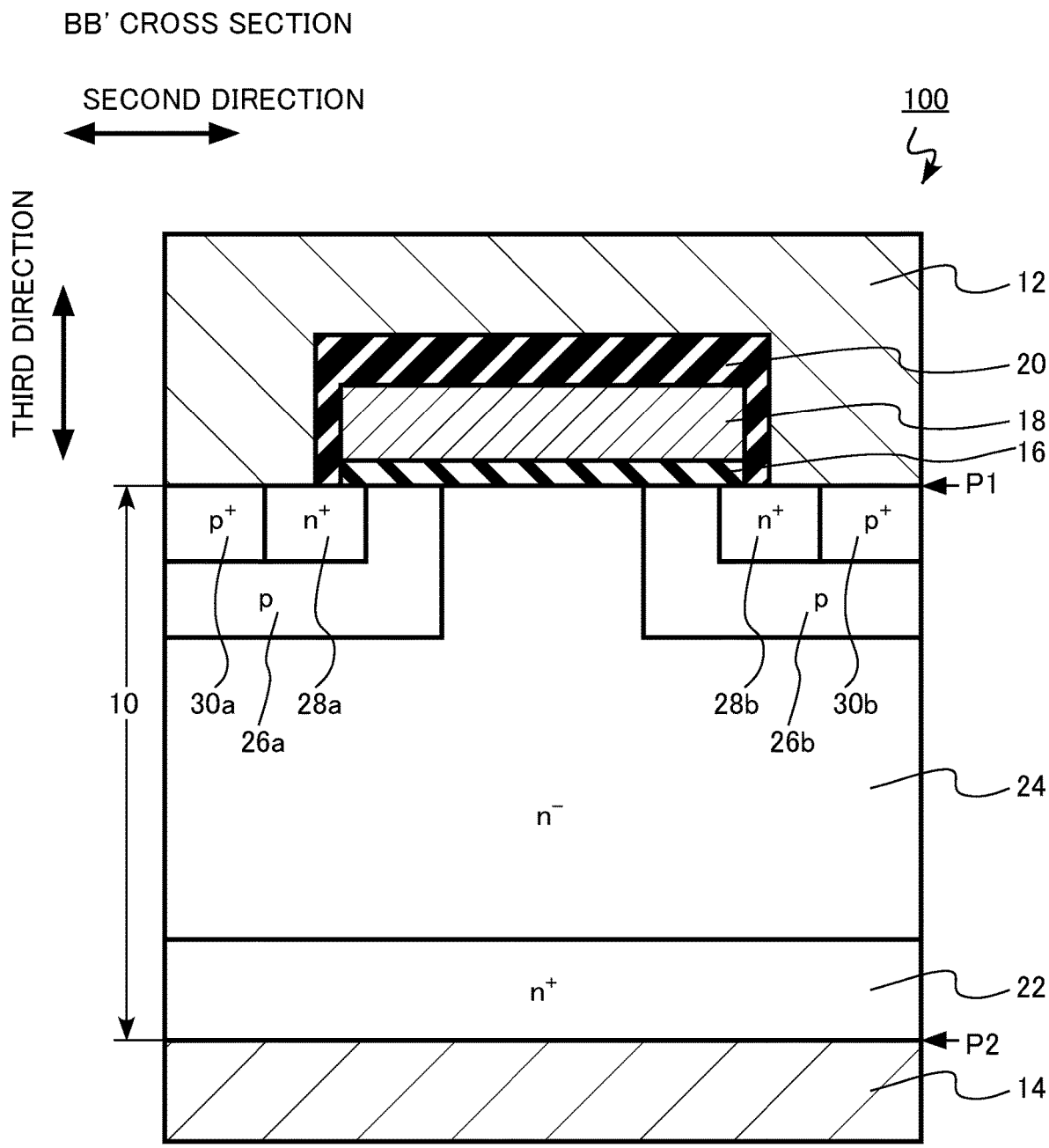
FIG. 3 is a schematic cross-sectional view of the semiconductor device of the first embodiment.

FIG. 1 is a schematic cross-sectional view of the semiconductor device of the first embodiment. FIG. 2 is a schematic top view of the semiconductor device of the first embodiment. FIG. 3 is a schematic cross-sectional view of the semiconductor device of the first embodiment.

FIG. 1 is a cross-sectional view taken along the line AA' of FIG. 2. FIG. 2 shows a pattern on a first face P1 of FIG. 1. FIG. 3 is a cross-sectional view taken along the line BB' of FIG. 2.

The MOSFET 100 includes a silicon carbide layer 10, a source electrode 12 (first electrode), a drain electrode (second electrode), a gate electrode 16, a gate insulating layer 18, and an interlayer insulating layer 20.

The silicon carbide layer 10 includes an n$^+$-type drain region 22, an n$^-$-type drift region 24 (first silicon carbide region), a p-type first body region 26a (second silicon carbide region), a p-type second body region 26b (third silicon carbide region), an n$^+$-type first source region 28a (fourth silicon carbide region), an n$^+$-type second source region 28b (fifth silicon carbide region), a p$^+$-type first contact region 30a, a p$^+$-type second contact region 30b, a p-type patch region 32 (sixth silicon carbide region), and a crystal defect 34.

The silicon carbide layer 10 is disposed between the source electrode 12 and the drain electrode 14. The silicon carbide layer 10 includes a first face ("P1" in FIG. 1) and a second face ("P2" in FIG. 1).

The second face P2 faces the first face P1. The second face P2 is parallel to the first face P1.

The first direction and the second direction are directions parallel to the first face P1. The second direction is a direction perpendicular to the first direction. In addition, the third direction is a direction perpendicular to the first face P1. The third direction is a direction perpendicular to the first direction and the second direction.

Hereinafter, the "depth" means a depth with respect to the first face P1. The "depth" is a distance in a third direction with respect to the first face P1.

The silicon carbide layer 10 is a single crystal SiC. The silicon carbide layer 10 is, for example, 4H—SiC. The first face P1 of the silicon carbide layer 10 is, for example, a face inclined by an angle equal to or more than 0° and equal to or less than 8° with respect to the silicon face. The silicon face is a (0001) face. The thickness of the silicon carbide layer 10 in the third direction is, for example, equal to or more than 5 μm and equal to or less than 500 μm.

The source electrode 12 is disposed on the first face P1 side of the silicon carbide layer 10. The source electrode 12 is provided on the first face P1 of the silicon carbide layer 10. The source electrode 12 is in contact with the first face P1.

The source electrode 12 contains a metal. The source electrode 12 contains, for example, aluminum (Al) or titanium (Ti). The source electrode 12 may include a silicide region in a portion in contact with the first face P1, for example.

The source electrode 12 is electrically connected to the first source region 28a, the second source region 28b, the first contact region 30a, and the second contact region 30b. The source electrode 12 is in contact with, for example, the first source region 28a, the second source region 28b, the first contact region 30a, and the second contact region 30b.

The drain electrode 14 is disposed on the second face P2 side of the silicon carbide layer 10. The drain electrode 14 is provided on the second face P2 of the silicon carbide layer 10. The drain electrode 14 is in contact with the second face P2.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

The drain electrode 14 is electrically connected to the drain region 22. The drain electrode 14 is in contact with, for example, the drain region 22.

The gate electrode 16 is disposed on the first face P1 side of the silicon carbide layer 10. The gate electrode 16 extends, for example, in the first direction.

The gate electrode 16 is a conductive layer. The gate electrode 16 is, for example, polycrystalline silicon containing p-type impurities or n-type impurities.

The gate insulating layer 18 is disposed between the gate electrode 16 and the silicon carbide layer 10. The gate insulating layer 18 is disposed between the first body region 26a and the gate electrode 16, between the second body region 26b and the gate electrode 16, and between the patch region 32 and the gate electrode 16.

The gate insulating layer 18 is, for example, a silicon oxide film. For example, an insulating film with a high dielectric constant can be applied to the gate insulating layer 18. In addition, for example, a stacked film of a silicon oxide film and an insulating film with a high dielectric constant can be applied to the gate insulating layer 18.

The thickness of the gate insulating layer 18 in the third direction is, for example, equal to or more than 30 nm and equal to or less than 100 nm.

The interlayer insulating layer 20 is provided on the gate electrode 16. The interlayer insulating layer 20 is provided between the gate electrode 16 and the source electrode 12.

The thickness of the interlayer insulating layer 20 in the third direction is larger than the thickness of the gate insulating layer 18 in the third direction, for example. The interlayer insulating layer 20 is, for example, a silicon oxide film. The interlayer insulating layer 20 electrically separates the gate electrode 16 and the source electrode 12 from each other.

The n$^+$-type drain region 22 is provided on the second face P2 side of the silicon carbide layer 10. The drain region 22 contains, for example, nitrogen (N) as an n-type impurity. The n-type impurity concentration in the drain region 22 is, for example, equal to or more than $1 \times 10^{18}$ cm$^{-3}$ and equal to or less than $1 \times 10^{21}$ cm$^{-3}$.

The n$^-$-type drift region 24 is provided on the drain region 22. The drift region 24 is disposed between the drain region 22 and the first face P1.

A part of the drift region 24 is in contact with the first face P1. A part of the drift region 24 is in contact with the gate insulating layer 18.

The drift region 24 contains, for example, nitrogen (N) as an n-type impurity. The n-type impurity concentration in the drift region 24 is lower than the n-type impurity concentration in the drain region 22. The n-type impurity concentration in the drift region 24 is, for example, equal to or more than $4 \times 10^{14}$ cm$^{-3}$ and equal to or less than $1 \times 10^{18}$ cm$^{-3}$.

The drift region 24 is, for example, a SiC epitaxial growth layer formed on the drain region 22 by epitaxial growth. The thickness of the drift region 24 in the second direction is, for example, equal to or more than 5 µm and equal to or less than 500 µm.

The p-type first body region 26a is disposed between the drift region 24 and the first face P1. The first body region 26a is in contact with the first face P1. The first body region 26a is in contact with the gate insulating layer 18. The first body region 26a extends, for example, in the first direction.

The first body region 26a functions as a channel forming region of the MOSFET 100. For example, when the MOSFET 100 is turned on, a channel through which electrons flow is formed in a region of the first body region 26a in contact with the gate insulating layer 18. The region of the first body region 26a in contact with the gate insulating layer 18 is the channel forming region.

The first body region 26a contains, for example, aluminum (Al) as a p-type impurity. The p-type impurity concentration in the first body region 26a is, for example, equal to or more than $5 \times 10^{16}$ cm$^{-3}$ and equal to or less than $5 \times 10^{19}$ cm$^{-3}$.

The depth of the first body region 26a is, for example, equal to or more than 0.4 µm and equal to or less than 0.8 µm. The thickness of the first body region 26a in the third direction is, for example, equal to or more than 0.1 µm and equal to or less than 0.3 µm.

The p-type second body region 26b is disposed between the drift region 24 and the first face P1. The second body region 26b is in contact with the first face P1. The second body region 26b is in contact with the gate insulating layer 18. A part of the drift region 24 is interposed between the second body region 26b and the first body region 26a. The second body region 26b extends, for example, in the first direction.

The second body region 26b functions as a channel forming region of the MOSFET 100. For example, when the MOSFET 100 is turned on, a channel through which electrons flow is formed in a region of the second body region 26b in contact with the gate insulating layer 18. The region of the second body region 26b in contact with the gate insulating layer 18 is the channel forming region.

The second body region 26b contains, for example, aluminum (Al) as a p-type impurity. The p-type impurity concentration in the second body region 26b is, for example, equal to or more than $5 \times 10^{16}$ cm$^{-3}$ and equal to or less than $5 \times 10^{19}$ cm$^{-3}$.

The depth of the second body region 26b is, for example, equal to or more than 0.4 µm and equal to or less than 0.8 µm. The thickness of the second body region 26b in the third direction is, for example, equal to or more than 0.1 µm and equal to or less than 0.3 µm.

The n$^+$-type first source region 28a is disposed between the first body region 26a and the first face P1. The first source region 28a is in contact with the first face P1. The first source region 28a is in contact with, for example, the source electrode 12. The first source region 28a extends, for example, in the first direction.

The first source region 28a contains, for example, phosphorus (P) as an n-type impurity. The n-type impurity concentration in the first source region 28a is higher than the n-type impurity concentration in the drift region 24. The n-type impurity concentration in the first source region 28a is, for example, equal to or more than $1 \times 10^{19}$ cm$^{-3}$ and equal to or less than $1 \times 10^{21}$ cm$^{-3}$.

The depth of the first source region 28a is smaller than the depth of the first body region 26a. The depth of the first source region 28a is, for example, equal to or more than 0.1 µm and equal to or less than 0.4 µm.

The n$^+$-type second source region 28b is disposed between the second body region 26b and the first face P1. The second source region 28b is in contact with the first face P1. The second source region 28b is in contact with, for example, the source electrode 12. The second source region 28b extends, for example, in the first direction.

The second source region 28b contains, for example, phosphorus (P) as an n-type impurity. The n-type impurity concentration in the second source region 28b is higher than the n-type impurity concentration in the drift region 24. The n-type impurity concentration in the second source region 28b is, for example, equal to or more than $1 \times 10^{19}$ cm$^{-3}$ and equal to or less than $1 \times 10^{21}$ cm$^{-3}$.

The depth of the second source region 28b is smaller than the depth of the second body region 26b. The depth of the second source region 28b is, for example, equal to or more than 0.1 µm and equal to or less than 0.4 µm.

The p$^+$-type first contact region 30a is disposed between the first body region 26a and the first face P1. The first contact region 30a is adjacent to the first source region 28a. The first contact region 30a is in contact with the first face P1. The first contact region 30a is in contact with, for example, the source electrode 12. The first contact region 30a extends, for example, in the first direction.

The first contact region 30a has a function of reducing the contact resistance of the source electrode 12. By providing the first contact region 30a, the electrical resistance between the source electrode 12 and the first body region 26a is reduced.

The first contact region 30a contains, for example, aluminum (Al) as a p-type impurity. The p-type impurity concentration in the first contact region 30a is higher than the p-type impurity concentration in the first body region 26a.

The p-type impurity concentration in the first contact region 30a is, for example, equal to or more than $1 \times 10^{19}$ cm$^{-3}$ and equal to or less than $1 \times 10^{21}$ cm$^{-3}$. The depth of the first contact region 30a is smaller than, for example, the depth of the first body region 26a.

The p$^+$-type second contact region 30b is disposed between the second body region 26b and the first face P1. The second contact region 30b is adjacent to the second source region 28b. The second contact region 30b is in contact with the first face P1. The second contact region 30b is in contact with, for example, the source electrode 12. The second contact region 30b extends, for example, in the first direction.

The second contact region 30b has a function of reducing the contact resistance of the source electrode 12. By providing the second contact region 30b, the electrical resistance between the source electrode 12 and the second body region 26b is reduced.

The second contact region 30b contains, for example, aluminum (Al) as a p-type impurity. The p-type impurity concentration in the second contact region 30b is higher than the p-type impurity concentration in the second body region 26b.

The p-type impurity concentration in the second contact region 30b is, for example, equal to or more than $1 \times 10^{19}$ cm$^{-3}$ and equal to or less than $1 \times 10^{21}$ cm$^{-3}$. The depth of the second contact region 30b is smaller than, for example, the depth of the second body region 26b.

The p-type patch region 32 is disposed between the drift region 24 and the first face P1. The patch region 32 is in contact with the first face P1. The patch region 32 is in contact with the gate insulating layer 18. The patch region 32 is in contact with the drift region 24.

The patch region 32 is disposed between the first body region 26a and the second body region 26b. The patch region 32 is disposed between the first body region 26a and the second body region 26b on the first face P1. The patch region 32 is interposed between the first body region 26a and the second body region 26b on the first face P1. The patch region 32 is in contact with, for example, the first body region 26a and the second body region 26b.

The patch region 32 is interposed between a part of the drift region 24 and another part of the drift region 24 on the first face P1.

The patch region 32 contains, for example, aluminum (Al) as a p-type impurity. The p-type impurity concentration in the patch region 32 is lower than, for example, the p-type impurity concentration in the first body region 26a and the p-type impurity concentration in the second body region 26b. The p-type impurity concentration in the patch region 32 is, for example, equal to or more than $1 \times 10^{18}$ cm$^{-3}$ and equal to or less than $1 \times 10^{19}$ cm$^{-3}$.

The depth (d1 in FIG. 1) of the patch region 32 is smaller than, for example, the depth (d2 in FIG. 1) of the first body region 26a. The depth d1 of the patch region 32 is smaller than, for example, the depth (d3 in FIG. 1) of the second body region 26b.

The depth d1 of the patch region 32 is, for example, equal to or more than 50% and equal to or less than 90% of the depth d2 of the first body region 26a. The depth of the patch region 32 is, for example, equal to or more than 50% and equal to or less than 90% of the depth d3 of the second body region 26b.

The depth of the patch region 32 is, for example, equal to or more than 0.05 μm and equal to or less than 0.35 μm.

At least a part of the crystal defect 34 is disposed in the patch region 32. For example, a part of the crystal defect 34 is disposed in the drift region 24.

The crystal defect 34 penetrates, for example, the silicon carbide layer 10. One end of the crystal defect 34 is in contact with the first face P1, for example. As shown in FIG. 2, one end of the crystal defect 34 is exposed on the first face P1, for example. The other end of the crystal defect 34 is in contact with the second face P2, for example. The other end of the crystal defect 34 is exposed on the second face P2, for example.

The crystal defect 34 is, for example, a line defect or a face defect. The crystal defect 34 is, for example, a threading dislocation. The crystal defect 34 is, for example, a spiral dislocation or a blade dislocation. The crystal defect 34 is, for example, a stacking fault.

FIGS. 1 and 2 show a case where the crystal defect 34 is a line defect. Since the crystal defect 34 is a line defect, as shown in FIG. 2, the crystal defect 34 exposed on the first face P1 has a point shape.

The crystal defect 34 exposed on the first face P1 is surrounded by the patch region 32 on the first face P1.

Next, an example of a method of manufacturing the semiconductor device of the first embodiment will be described.

First, the silicon carbide layer 10 having the drift region 24 formed by epitaxial growth on the drain region 22 is prepared. Then, the position of the crystal defect 34 exposed on the first face P1 of the silicon carbide layer 10 is specified. For example, the position of the crystal defect 34 can be specified by a defect inspection device using photoluminescence.

Then, ion implantation of impurities is performed from the first face P1 side of the silicon carbide layer 10 to form the n$^+$-type drain region 22, the n$^-$-type drift region 24, the p-type first body region 26a, the p-type second body region 26b, the n$^+$-type first source region 28a, the n$^+$-type second source region 28b, the p$^+$-type first contact region 30a, and the p$^+$-type second contact region 30b.

Then, p-type impurities are ion-implanted into a region (X surrounded by the solid line and the dotted line in FIG. 2) including the crystal defect 34 whose position has been specified in advance. The p-type impurities are, for example, aluminum.

For example, a maskless exposure apparatus that does not use a mask is used to provide an opening in a portion corresponding to the region X of the resist. The patch region 32 is formed by ion-implanting p-type impurities with the resist, in which an opening is provided, as a mask.

Then, heat treatment is performed to activate the impurities ion-implanted into the silicon carbide layer 10.

Then, using a known process technique, the gate insulating layer 18, the gate electrode 16, the interlayer insulating layer 20, the source electrode 12, and the drain electrode 14 are formed.

By the manufacturing method described above, the MOSFET 100 shown in FIGS. 1 to 3 is manufactured.

Next, the function and effect of the semiconductor device of the first embodiment will be described.

In MOSFETs using silicon carbide, a gate insulating layer with high reliability is required.

Figure 4:
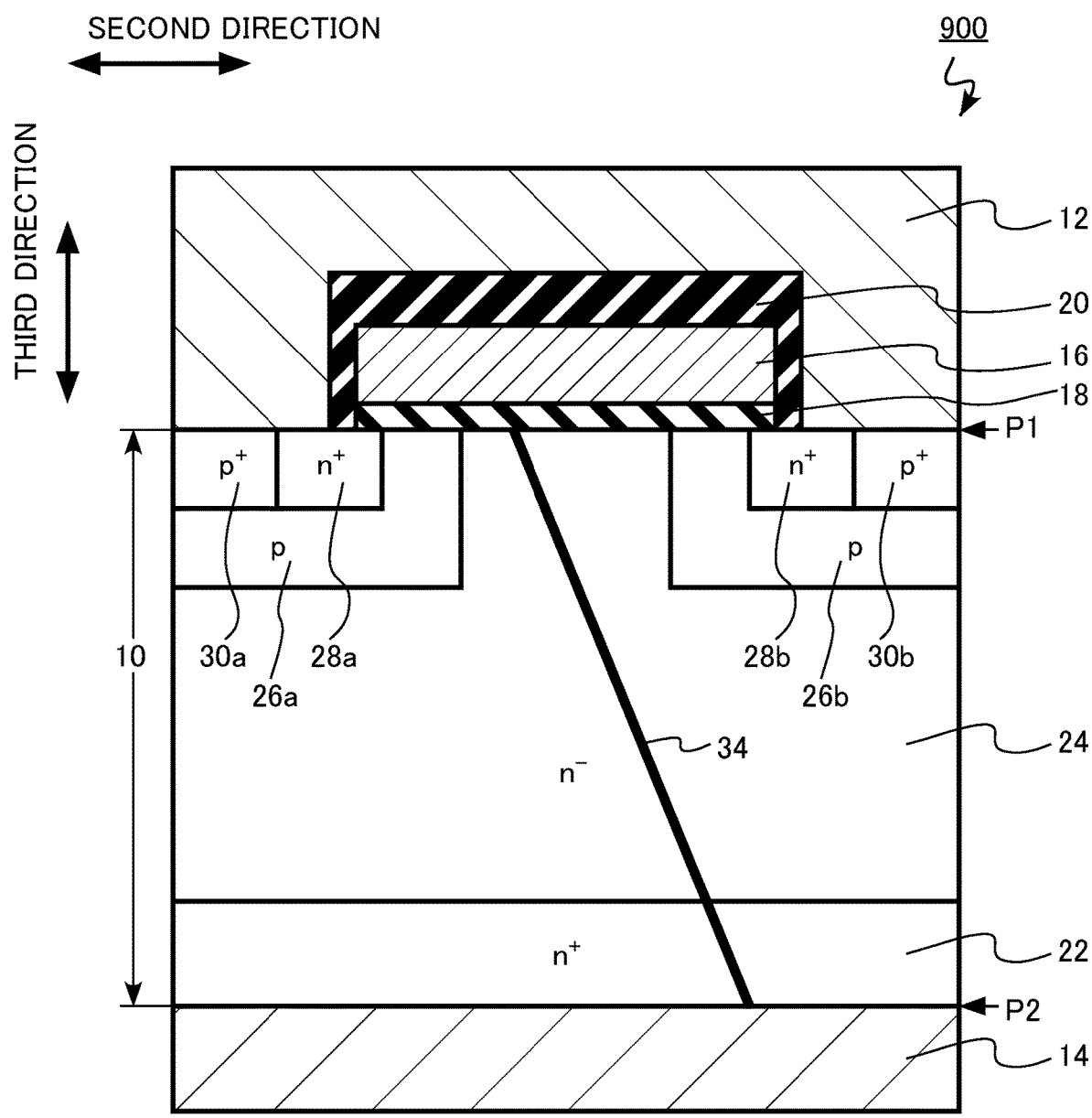
FIG. 4 is a schematic cross-sectional view of a semiconductor device of a comparative example.

FIG. 4 is a schematic cross-sectional view of a semiconductor device of a comparative example. FIG. 4 is a cross-sectional view corresponding to FIG. 1.

A MOSFET 900 of the comparative example is different from the MOSFET 100 of the first embodiment in that the silicon carbide layer 10 does not include the patch region 32.

Figure 5:
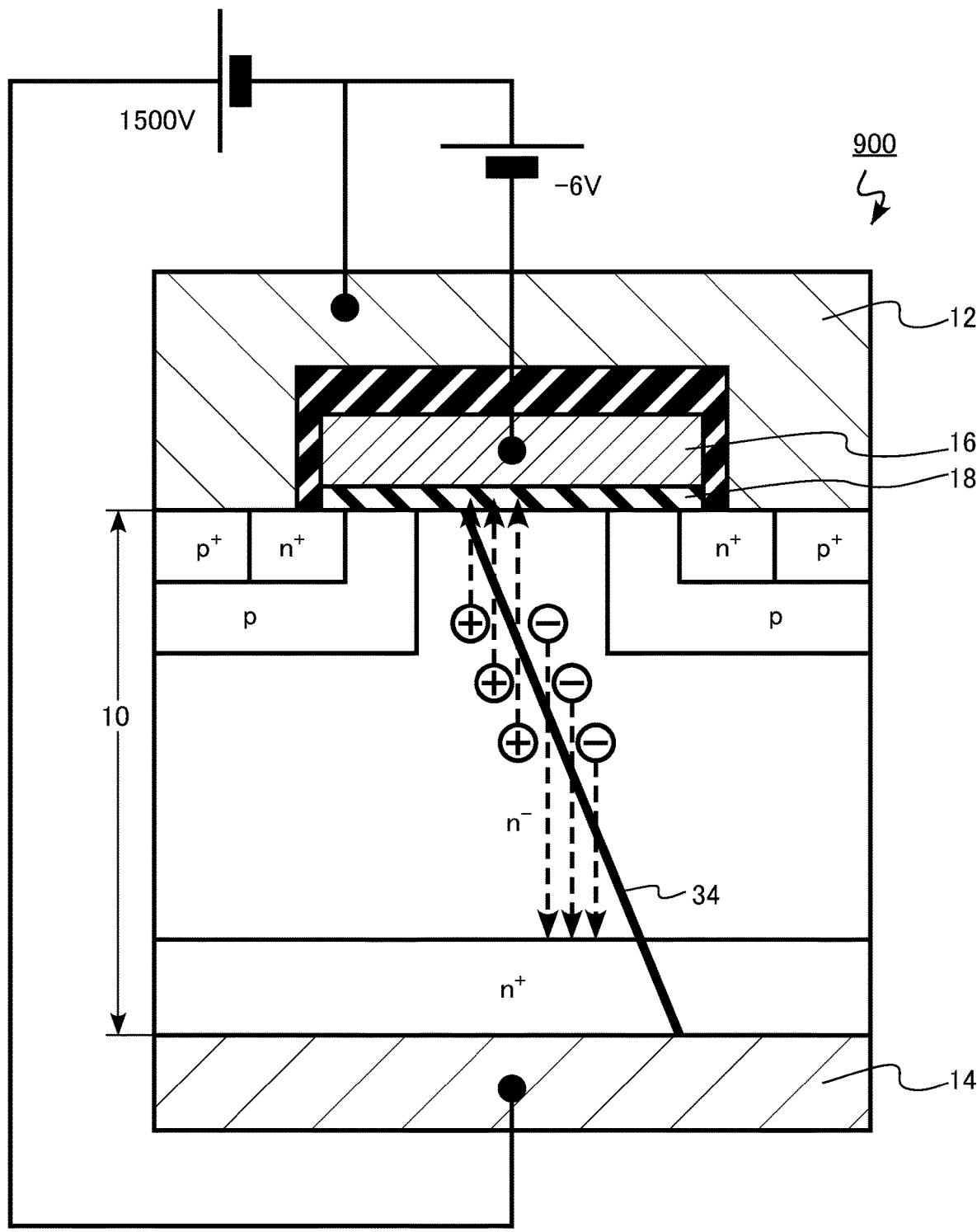
FIG. 5 is an explanatory diagram of a problem of the semiconductor device of the comparative example.

FIG. 5 is an explanatory diagram of a problem of the semiconductor device of the comparative example. FIG. 5 shows bias conditions in the off state of the MOSFET 900.

A positive high voltage, for example 1500 V, is applied between the source electrode 12 and the drain electrode 14. In addition, a negative voltage, for example, −6 V is applied between the source electrode 12 and the gate electrode 16.

The crystal defect 34 forms a level in the bandgap of SiC, for example. Due to the level in the bandgap, electron-hole pairs are generated.

As shown in FIG. 5, holes of the generated electron-hole pairs move to the gate electrode 16 side due to the electric field in the drift region. The moved holes are injected into the gate insulating layer 18. When holes are injected into the gate insulating layer 18, the amount of leakage current flowing between the silicon carbide layer 10 and the gate electrode 16 increases. As the amount of leakage current increases, dielectric breakdown of the gate insulating layer 18 is likely to occur. Therefore, the reliability of the gate insulating layer 18 may be reduced.

In addition, when the crystal defect 34 is exposed on the first face P1, a recess is formed on the first face P1. For example, in the gate insulating layer 18 on the recess, electric field concentration is likely to occur due to the shape. Therefore, dielectric breakdown of the gate insulating layer 18 on the recess is likely to occur. As a result, the reliability of the gate insulating layer 18 may be reduced.

Figure 6:
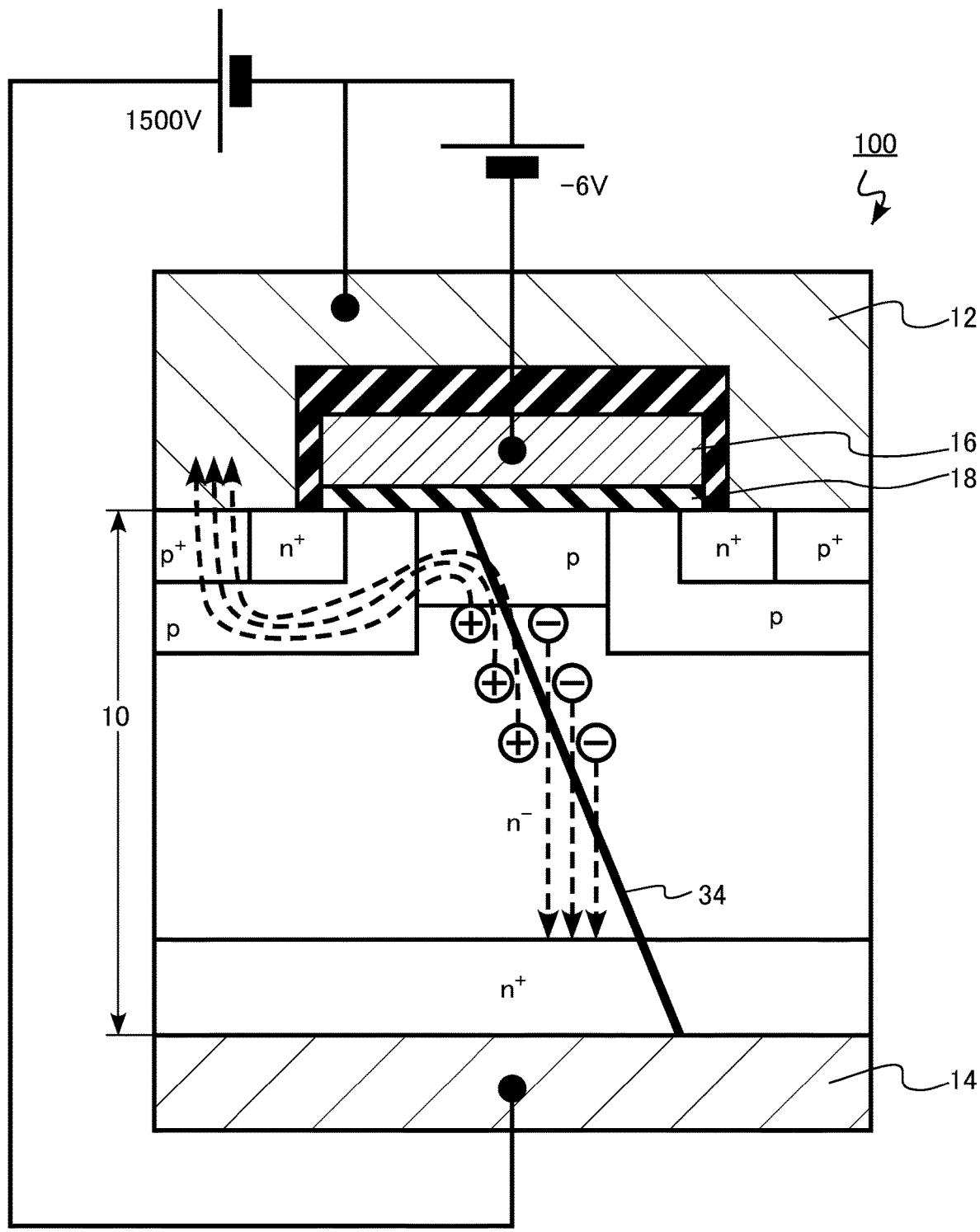
FIG. 6 is an explanatory diagram of the function and effect of the semiconductor device of the first embodiment.

FIG. 6 is an explanatory diagram of the function and effect of the semiconductor device of the first embodiment. FIG. 6 shows bias conditions in the off state of the MOSFET 100. A bias similar to that in FIG. 5 is applied between the source electrode 12 and the drain electrode 14 and between the source electrode 12 and the gate electrode 16.

In the MOSFET 100 of the first embodiment, the silicon carbide layer 10 includes the patch region 32. The patch region 32 surrounds the end of the crystal defect 34 on the first face P1 side.

Holes generated due to the crystal defect 34 flow to the source electrode 12 through the patch region 32, as shown in FIG. 6. Therefore, the amount of holes injected into the gate insulating layer 18 is reduced as compared with the case of the comparative example. As a result, the reliability of the gate insulating layer 18 is improved.

In addition, in the MOSFET 100, the strength of the electric field applied to the gate insulating layer 18 decreases due to the depletion of the patch region 32. Therefore, even if the recess is present on the first face P1, the electric field concentration of the gate insulating layer 18 on the recess is relaxed. As a result, the reliability of the gate insulating layer 18 is improved.

It is preferable that the depth d1 of the patch region 32 is smaller than the depth d2 of the first body region 26a and the depth d3 of the second body region 26b. The depth d1 of the patch region 32 is preferably equal to or less than 90%, more preferably equal to or less than 80% of the depth d2 of the first body region 26a. The depth d1 of the patch region 32 is preferably equal to or less than 90%, more preferably equal to or less than 80% of the depth d3 of the second body region 26b.

By making the depth d1 of the patch region 32 smaller than the depth d2 of the first body region 26a and the depth d3 of the second body region 26b, it is possible to suppress the occurrence of avalanche breakdown between the patch region 32 and the drift region 24 in the off state of the MOSFET 100. Therefore, it is possible to suppress a reduction in the breakdown voltage of the MOSFET 100 due to the provision of the patch region 32.

The depth d1 of the patch region 32 is preferably equal to or more than 50%, more preferably equal to or less than 60% of the depth d2 of the first body region 26a. The depth d1 of the patch region 32 is preferably equal to or more than 50%, more preferably equal to or less than 60% of the depth d3 of the second body region 26b.

By increasing the depth d1 of the patch region 32, it is possible to prevent the depletion layer formed in the patch region 32 from reaching the gate insulating layer 18 in the off state of the MOSFET 100. Therefore, it is possible to suppress an increase in the strength of the electric field applied to the gate insulating layer 18. As a result, the reliability of the gate insulating layer 18 is improved.

In addition, by increasing the depth d1 of the patch region 32, the amount of holes flowing to the source electrode 12 through the patch region 32 increases. Therefore, the amount of holes injected into the gate insulating layer 18 is reduced as compared with the case of the comparative example. As a result, the reliability of the gate insulating layer 18 is improved.

It is preferable that the p-type impurity concentration in the patch region 32 is lower than the p-type impurity concentration in the first body region 26a and the p-type impurity concentration in the second body region 26b. It is preferable that the p-type impurity concentration in the patch region 32 is equal to or less than $1 \times 10^{19}$ cm$^{-3}$.

By lowering the p-type impurity concentration in the patch region 32, it is possible to suppress the occurrence of avalanche breakdown between the patch region 32 and the drift region 24 in the off state of the MOSFET 100. Therefore, it is possible to suppress a reduction in the breakdown voltage of the MOSFET 100 due to the provision of the patch region 32.

The p-type impurity concentration in the patch region 32 is preferably equal to or more than $1 \times 10^{18}$ cm$^{-3}$, and more preferably equal to or more than $3 \times 10^{18}$ cm$^{-3}$.

By increasing the p-type impurity concentration in the patch region 32, it is possible to prevent the depletion layer formed in the patch region 32 from reaching the gate insulating layer 18 in the off state of the MOSFET 100. Therefore, it is possible to suppress an increase in the strength of the electric field applied to the gate insulating layer 18. As a result, the reliability of the gate insulating layer 18 is improved.

In addition, by increasing the p-type impurity concentration in the patch region 32, the amount of holes flowing to the source electrode 12 through the patch region 32 in the off state of the MOSFET 100 increases. Therefore, the amount of holes injected into the gate insulating layer 18 is reduced. As a result, the reliability of the gate insulating layer 18 is improved.

It is preferable that the patch region 32 is in contact with both the first body region 26a and the second body region 26b. Both the first body region 26a and the second body region 26b can function as paths for holes to flow through the source electrode 12. Therefore, the amount of holes injected into the gate insulating layer 18 is reduced. As a result, the reliability of the gate insulating layer 18 is improved.

As described above, according to the first embodiment, it is possible to realize a MOSFET capable of improving the reliability of the gate insulating layer.

Second Embodiment

A semiconductor device of a second embodiment is the same as that of the first embodiment except that the crystal defect is a face defect. Hereinafter, the description of a part of the content overlapping the first embodiment will be omitted.

Figure 7:
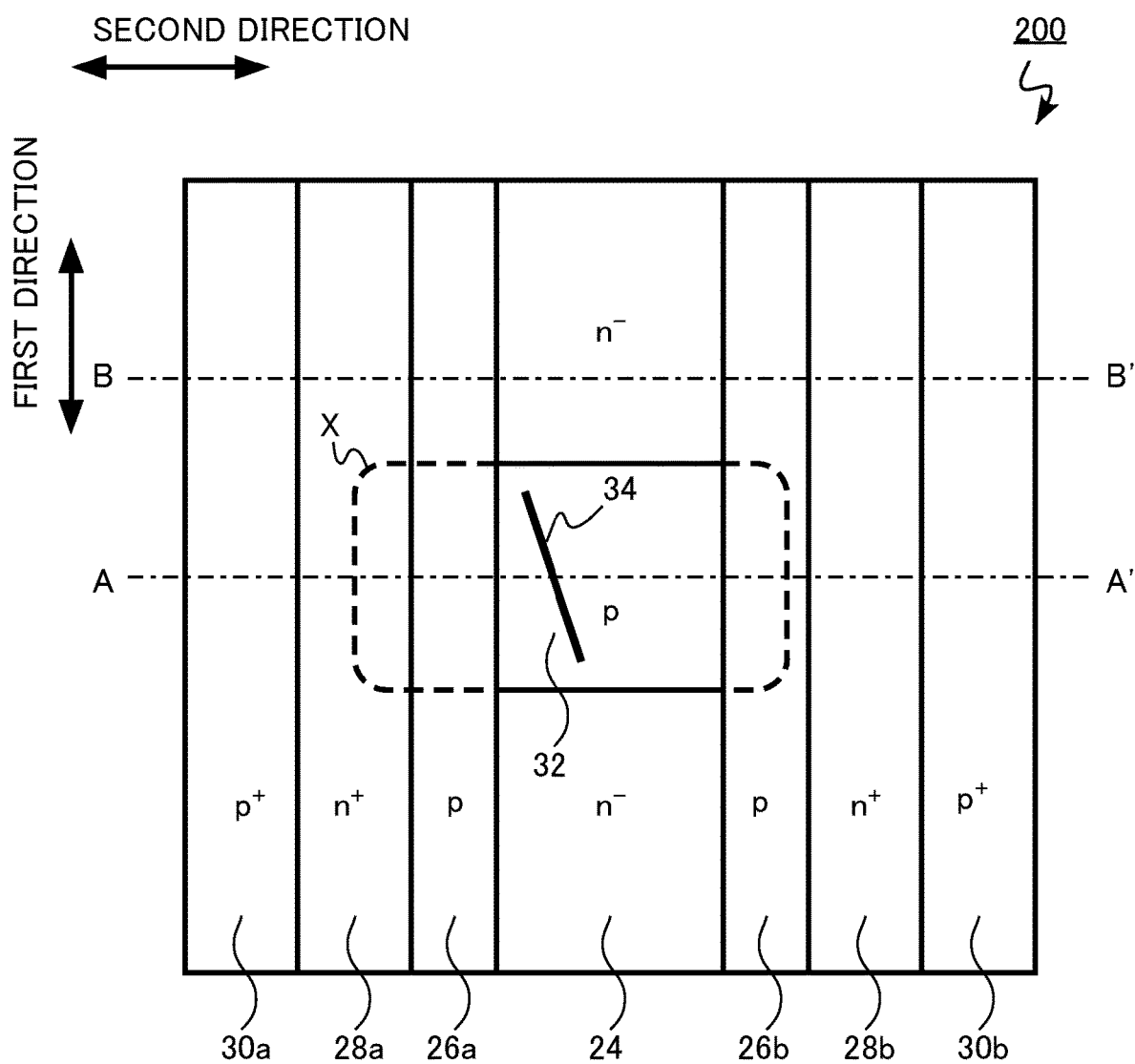
FIG. 7 is a schematic top view of a semiconductor device of a second embodiment.

FIG. 7 is a schematic cross-sectional view of the semiconductor device of the second embodiment. FIG. 7 is a diagram corresponding to FIG. 2 of the first embodiment.

In a MOSFET 200 of the second embodiment, the crystal defect 34 included in the silicon carbide layer 10 is a face defect. The crystal defect 34 is, for example, a stacking fault.

Since the crystal defect 34 is a face defect, as shown in FIG. 7, the crystal defect 34 exposed on the first face P1 has a linear shape. The patch region 32 surrounds the entire crystal defect 34 having a linear shape on the first face P1.

As described above, according to the second embodiment, it is possible to realize a MOSFET capable of improving the reliability of the gate insulating layer, as in the first embodiment.

Third Embodiment

A semiconductor device of a third embodiment is different from that of the first embodiment in that the sixth silicon carbide region is spaced from the third silicon carbide region. Hereinafter, the description of a part of the content overlapping the first embodiment will be omitted.

Figure 8:
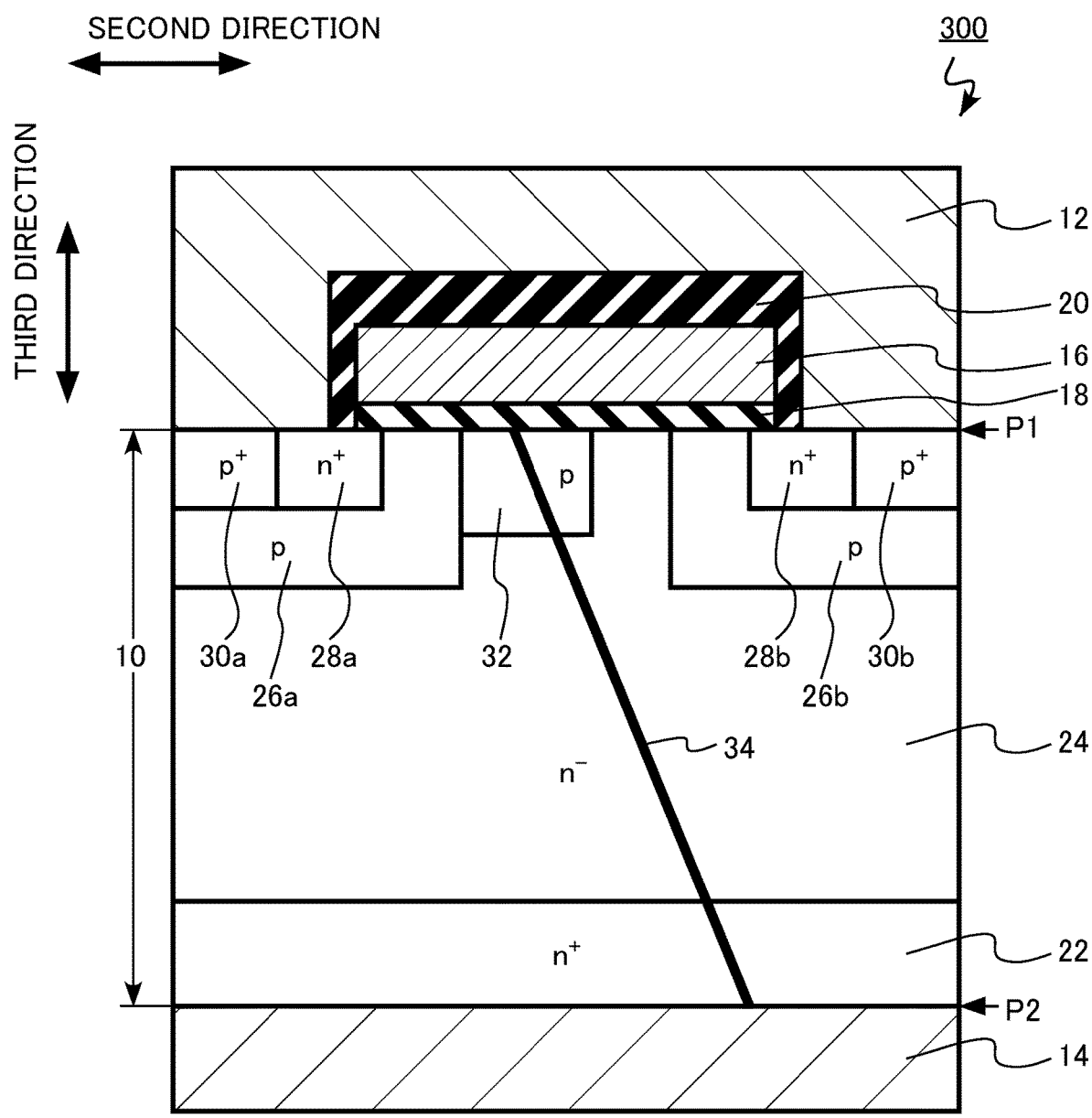
FIG. 8 is a schematic cross-sectional view of a semiconductor device of a third embodiment.

FIG. 8 is a schematic cross-sectional view of the semiconductor device of the third embodiment. FIG. 8 is a diagram corresponding to FIG. 1 of the first embodiment.

In a MOSFET 300 of the third embodiment, the patch region 32 and the second body region 26b are spaced from each other. A part of the drift region 24 is interposed between the patch region 32 and the second body region 26b.

As described above, according to the third embodiment, it is possible to realize a MOSFET capable of improving the reliability of the gate insulating layer, as in the first embodiment.

In the first to third embodiments, the case of 4H-SiC has been described as an example of the crystal structure of silicon carbide. However, the embodiments can also be applied to silicon carbide having other crystal structures, such as 6H—SiC and 3C—SiC.

In addition, in the first to third embodiments, the case where the gate insulating layer is provided on the silicon face of the silicon carbide layer has been described as an example. However, the embodiments can also be applied to a case where the gate insulating layer is provided on the other faces of the silicon carbide, for example, a carbon face, an m face, an a face, and a (0-33-8) face.

In addition, in the first to third embodiments, the case where the first conductive type is n type and the second conductive type is p type has been described as an example. However, the first conductive type can be p type and the second conductive type can be n type. In this case, the MOSFET is a p-channel type.

In addition, the embodiments can be applied to an insulated gate bipolar transistor (IGBT).

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a silicon carbide layer having a first face and a second face facing the first face and including:
a first silicon carbide region of a first conductive type;
a second silicon carbide region of a second conductive type disposed between the first silicon carbide region and the first face;
a third silicon carbide region of a second conductive type disposed between the first silicon carbide region and the first face, the first silicon carbide region being interposed between the second silicon carbide region and the third silicon carbide region;
a fourth silicon carbide region of a first conductive type disposed between the second silicon carbide region and the first face;
a fifth silicon carbide region of a first conductive type disposed between the third silicon carbide region and the first face;
a sixth silicon carbide region of a second conductive type disposed between the first silicon carbide region and the first face and disposed between the second silicon carbide region and the third silicon carbide region; and
a crystal defect, at least a part of the crystal defect being disposed in the sixth silicon carbide region;
a gate electrode disposed on a side of the first face of the silicon carbide layer;
a gate insulating layer disposed between the second silicon carbide region and the gate electrode, between the third silicon carbide region and the gate electrode, and between the sixth silicon carbide region and the gate electrode;
a first electrode disposed on a side of the first face of the silicon carbide layer; and
a second electrode disposed on a side of the second face of the silicon carbide layer.

2. The semiconductor device according to claim 1, wherein the gate insulating layer is in contact with the sixth silicon carbide region.

3. The semiconductor device according to claim 1, wherein the sixth silicon carbide region is in contact with the second silicon carbide region and the third silicon carbide region.

4. The semiconductor device according to claim 1, wherein a depth of the sixth silicon carbide region is smaller than a depth of the second silicon carbide region and a depth of the third silicon carbide region.

5. The semiconductor device according to claim 1, wherein a second conductive type impurity concentration in the sixth silicon carbide region is lower than a second conductive type impurity concentration in the second silicon carbide region and a second conductive type impurity concentration in the third silicon carbide region.

6. The semiconductor device according to claim 1, wherein a second conductive type impurity concentration in the sixth silicon carbide region is equal to or more than $1 \times 10^{18}$ cm$^{-3}$.

7. The semiconductor device according to claim 1, wherein the crystal defect is in contact with the first face.

8. The semiconductor device according to claim 1, wherein a part of the crystal defects is disposed in the first silicon carbide region.

9. The semiconductor device according to claim 6, wherein the second conductive type impurity concentration in the sixth silicon carbide region is equal to or less than $1 \times 10^{19}$ cm$^{-3}$.

10. The semiconductor device according to claim 1, wherein a depth of the sixth silicon carbide region is equal to or more than 50% and equal to or less than 90% of a depth of the second silicon carbide region and a depth of the third silicon carbide region.

11. The semiconductor device according to claim 7, wherein the crystal defect is in contact with the second face.

\* \* \* \* \*